United States Patent [19]

Geoghegan et al.

[11] Patent Number: 5,409,399
[45] Date of Patent: Apr. 25, 1995

[54] ELECTRICAL CONNECTION ASSEMBLY FOR MOUNTING ON A PRINTED CIRCUIT BOARD

[75] Inventors: Frank L. Geoghegan, Hinsdale; Bruce A. Peterson, Schaumburg, both of Ill.

[73] Assignee: Molex Incorporated, Lisle, Ill.

[21] Appl. No.: 164,316

[22] Filed: Dec. 8, 1993

[51] Int. Cl.⁶ ............................................. H01R 13/60
[52] U.S. Cl. .................................................... 439/567
[58] Field of Search ................................. 439/82-84, 439/567

[56] References Cited

U.S. PATENT DOCUMENTS

| | | | |
|---|---|---|---|
| 3,989,331 | 11/1976 | Hanlon | 439/83 X |
| 4,548,447 | 10/1985 | Dinsmore | 439/83 X |
| 4,735,587 | 4/1988 | Kirayoglu | 439/82 X |
| 4,847,588 | 7/1989 | Doutrich | 439/751 |
| 5,076,804 | 12/1991 | Bertho et al. | 439/567 |
| 5,199,907 | 4/1993 | Jansen et al. | 439/82 X |

FOREIGN PATENT DOCUMENTS

| | | | |
|---|---|---|---|
| 52-161454 | 12/1977 | Japan | H01R 13/00 |
| 56-72485 | 6/1981 | Japan | H01R 13/40 |
| 57-80087 | 5/1982 | Japan | H01R 9/09 |
| 57-82076 | 5/1982 | Japan | H01R 9/09 |
| 59-107170 | 7/1984 | Japan | H01R 13/62 |
| 60-41647 | 12/1985 | Japan | H01R 9/09 |

Primary Examiner—Eugene F. Desmond
Attorney, Agent, or Firm—Stephen Z. Weiss

[57] ABSTRACT

A system is disclosed for maintaining an electrical connector assembly mounted on a printed circuit board during soldering of the assembly to the board. A housing has a plurality of terminals mounted therein. The terminals include solder tails projecting from the housing for insertion into respective holes in the printed circuit board. Each terminal is stamped in planar form of sheet metal material. The solder tails are arranged in a row of pairs thereof, with the solder tails in each row being in a plane transverse to the row. All of the solder tails are of similar shape with each solder tail including a straight intermediate section projecting from the housing, a straight tip section for insertion into a respective hole in the printed circuit board, and an offset curved section between the intermediate and tip sections. The curved section of one solder tail extends in a direction transverse to the row opposite to the curved section of the other solder tail in each pair thereof. Each curved section is shaped such that each solder tail engages the circuit board within its respective hole only at a portion of the curved section. The straight intermediate section and the straight tip section of each solder tail are collinear.

7 Claims, 3 Drawing Sheets

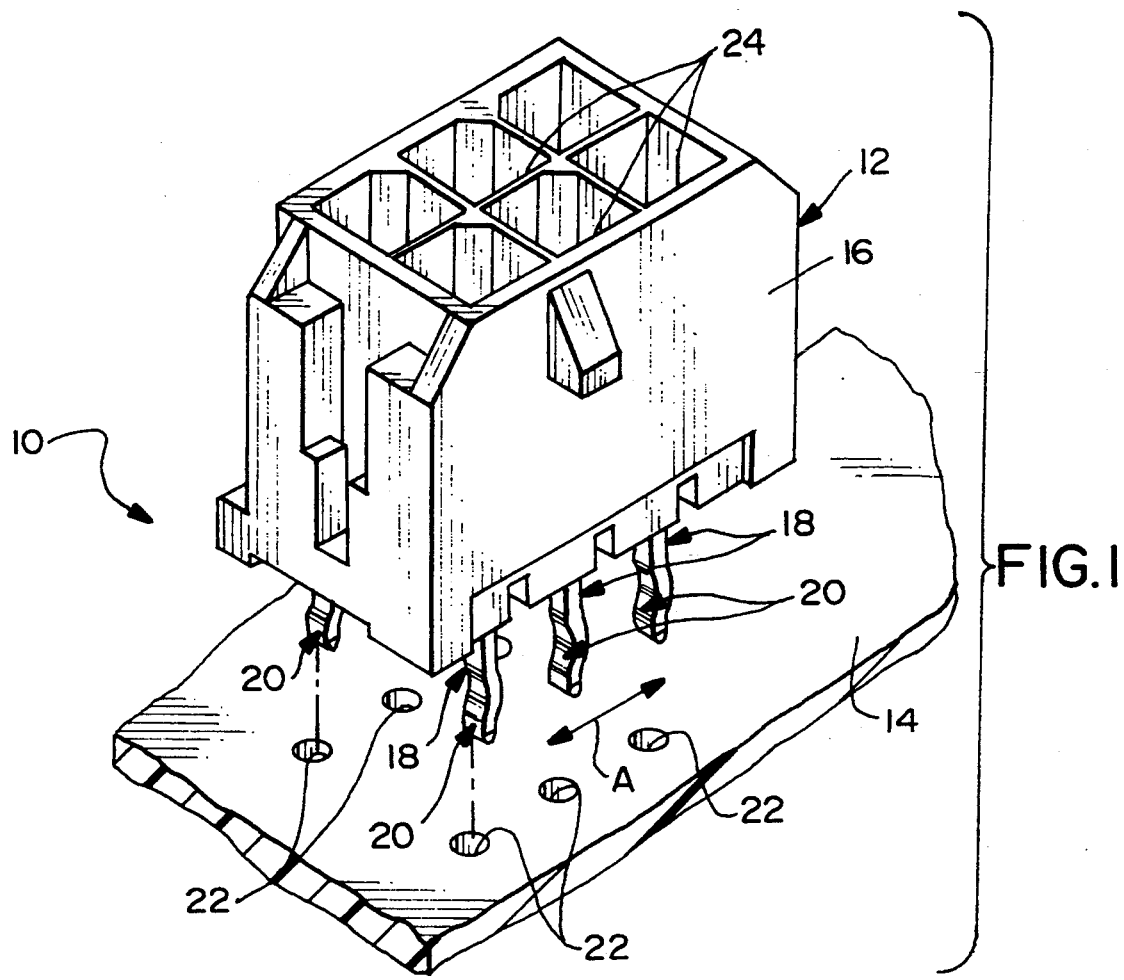
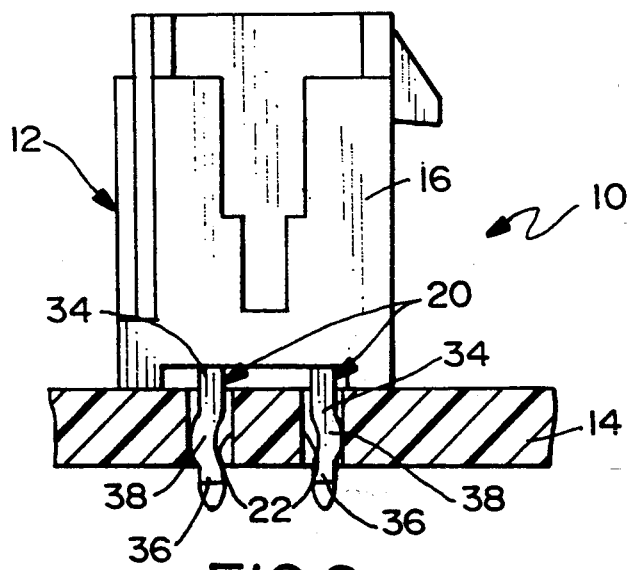

ELECTRICAL CONNECTION ASSEMBLY FOR MOUNTING ON A PRINTED CIRCUIT BOARD

FIELD OF THE INVENTION

This invention generally relates to the art of electrical connectors and, particularly, to an electrical connector assembly of the type adapted for mounted on a printed circuit board.

BACKGROUND OF THE INVENTION

Multi-circuit electrical connectors of the type adapted for mounting on a printed circuit board typically include a plurality of electrical contact members or terminals disposed within a unitary dielectric housing, normally a molded plastic housing in which the terminals are inserted following molding. In these assemblies, the housing typically surrounds portions of the terminals adjacent the printed circuit board to provide rigid support for the terminals. In some instances, one or more mounting posts are molded integrally with the housing and are positionable in holes in the printed circuit board.

The terminals of such connector assemblies often have solder tails insertable through holes in the printed circuit board for soldering to circuit traces on the board and/or in the holes. The solder tails sometimes are used to lock the connector assembly to the circuit board prior to soldering or at least to maintain the connector assembly mounted on the board during soldering of the assembly to the board. This locking often is accomplished by enlarged head portions or laterally projecting hooks which snap under the bottom side of the printed circuit board and thereby hold the connector assembly to the board. The terminals may be thin stamped contact members, with a stamped locking hook projecting outwardly from one side of the solder tail portion for locking under the bottom side of the board.

One of the problems in using "hooked" solder tails of the terminals for locking the connector assembly to the circuit board is in accommodating variances in the size or location of the holes in the board through which the solder tails are inserted and variances in the dimensions of the solder tail. U.S. Pat. No. 5,076,804 to Bertho et al, dated Dec. 31, 1991 and assigned to the assignee of this invention, is directed specifically to those problems in "hooked" solder tails by providing an electrical connector assembly with terminals which have hooked solder tails considerably less sensitive to variations in the holes in the printed circuit board.

Another approach involving the use of the solder tails for maintaining an electrical connector assembly mounted on a printed circuit board during soldering of the assembly to the board is shown in U.S. Pat. No. 4,847,588 to Doutrich, dated Jul. 11, 1989. Rather than employing stamped terminals, the electrical connector assembly disclosed in that patent uses a plurality of terminal pins which are relatively thick and stiff. Ends of the pins define the solder tails. A few of the total number of pins in the connector assembly have offset portions in the form of crimps. Each crimp is shaped so that each pin contacts the printed circuit board only within its respective hole and only on one side of the hole and only at its crimp. This patent specifically discloses that the crimp exerts a relatively high normal force against the board at one side of the respective hole, and the remainder of the pins are straight (i.e. without a crimp).

One of the problems in using thick and stiff pins as the solder tails in connector assemblies as described above, again revolves around accommodating variances in the size or location of the holes in the printed circuit board into which the pins are inserted and variances in the dimensions of the solder tails. Forming thick and stiff pins with crimps, as described above, is not near as exacting a fabrication technique as in stamping metal. Therefore, the crimps must be offset an excess amount to accommodate the variance of tolerances in the solder tails to ensure they contact the circuit board holes. In many assemblies, this results in unduly high insertion forces in mounting the connector assembly to the board. That is why only a few of the solder tails of the stiff and thick terminal pins in the U.S. Pat. No. 4,847,588 are crimped, while the remainder of the pins are straight. Therefore, two different types of terminal pins must be fabricated for use in a single connector assembly which, of course, increases the costs of manufacturing the assembly.

It can be seen from the above that, whether connector assemblies employ stamped "hooked" terminals or thick and stiff crimped terminals, problems continue to persist in using the solder tails of the terminals as the means for maintaining an electrical connector assembly mounted on a printed circuit board during soldering processes. The present invention is directed to an improved electrical connector assembly of the type adapted for mounting to a printed circuit board, utilizing the solder tails of the terminals for holding the assembly to the board during soldering.

SUMMARY OF THE INVENTION

An object, therefore, of the invention is to provide a new and improved system for maintaining an electrical connector assembly mounted on a printed circuit board during soldering of the assembly to the board.

In the exemplary embodiment of the invention, the system includes a housing having a plurality of terminals mounted therein. The terminals include solder tails projecting from the housing for insertion into respective holes in the printed circuit board. Each terminal is stamped in planar form of sheet metal material. The solder tails are arranged in a row of pairs thereof, with the solder tails in each pair being in a plane transverse to the row. All of the solder tails are of similar shape with each solder tail including a straight intermediate section projecting from the housing, a straight tip section for insertion into a respective hole in the printed circuit board, and an offset curved section between the intermediate and tip sections. The curved section of one solder tail extends in a direction transverse to the row opposite to the curved section of the other solder tail in each pair thereof. Each curved section is shaped such that each solder tail engages the printed circuit board only at its curved section within its respective hole. The straight section and the tip section of each solder tail are collinear.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

FIG. 1 is a perspective view of an electrical connector assembly and a printed circuit board incorporating the system of the invention;

FIG. 2 is an end elevation view of the connector assembly mounted to the printed circuit board, with the board in section;

DETAILED DESCRIPTION OF THE PREFERRED EMBODIMENT

Figure 3:
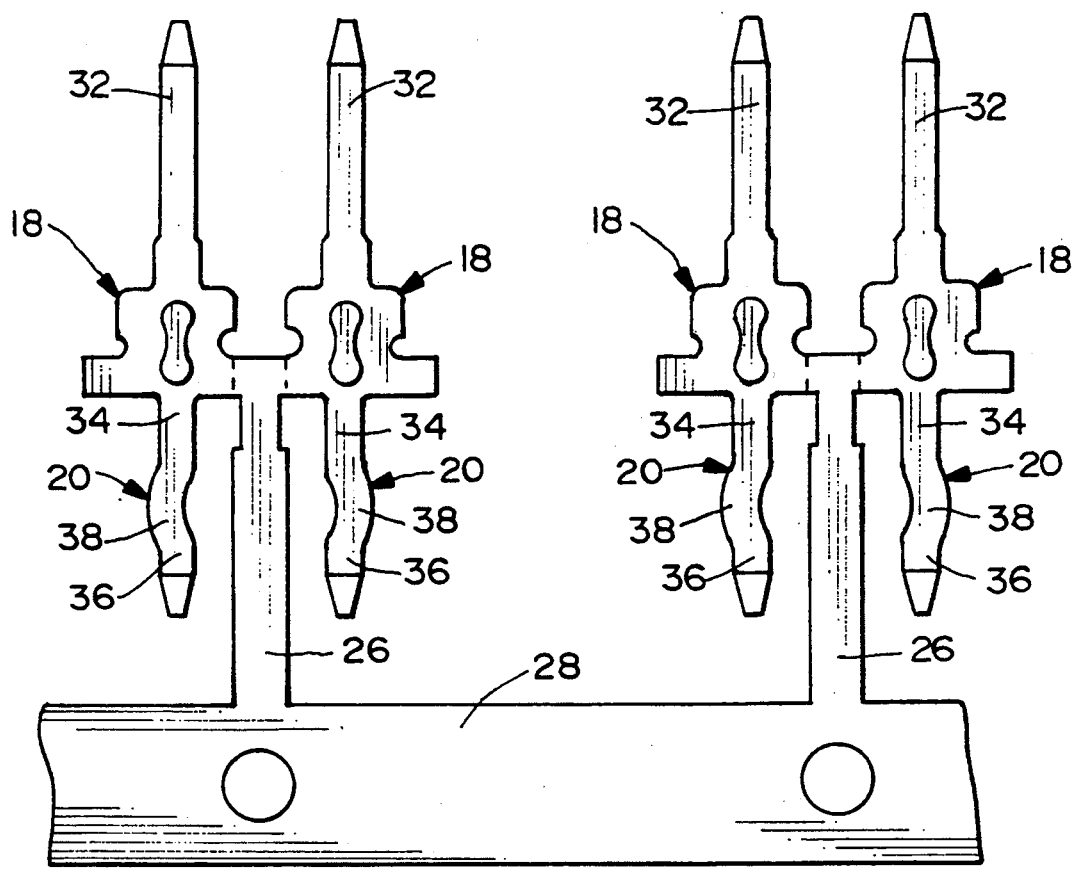
FIG. 3 is a depiction of two pairs of terminals as they are stamped from a continuous strip of sheet metal material.

Referring to the drawings in greater detail, and first to FIG. 1, a system, generally designated 10, is provided for maintaining an electrical connector assembly, generally designated 12, mounted on a printed circuit board 14 during soldering of the assembly to the board.

Connector assembly 12 includes a housing 16 unitarily molded of dielectric material, such as plastic or the like, for mounting a plurality of terminals, generally designated 18, therein. The terminals include solder tails, generally designated 20, projecting from the bottom of the housing for insertion into respective holes 22 in printed circuit board 14. Housing 16 includes a plurality of terminal-receiving passages 24 for receiving portions, such as "silos", of a complementary mating connector assembly (not shown).

Terminals 18 are mounted within terminal-receiving passages 24 such that solder tails 20 are arranged in a row of pairs thereof, the row extending generally in the direction of double-headed arrow "A" (FIG. 1). The solder tails in each pair thereof are in a plane extending transverse to the row. This can be seen by the array of holes 22 in board 14 and the array of terminal-receiving passages 24 in housing 16. This arrangement also can be seen by the one pair of solder tails extending into their respective holes 22 in FIG. 2.

Referring to FIG. 3, all of terminals 18 and their solder tails 20 are of similar shape and each terminal is stamped in planar form from sheet metal material. FIG. 3 shows two pairs of terminals respectively joined by a pair of sheet metal webs 26 to a carrier strip 28 which carries the terminals through a stamping processing machine as is known in the stamping art. Each terminal includes a body portion 30 and a contact pin 32 projecting from the body portion opposite solder tail 20. The body portions are used to rigidly mount the terminals within their respective terminal-receiving passages 24 (FIG. 1). Contact pins 32 project into the passages for interengagement with respective female contacts or sockets of the complementary mating connector assembly.

As stated above, all of the solder tails 20 of terminals 18 are similar in shape. Still referring to FIG. 3, each solder tail includes a straight intermediate section 34 which projects from housing 16 as seen in FIG. 2, a straight tip section 36 for insertion into a respective hole 22 in printed circuit board 14, and an offset curved section 38 between the intermediate and tip sections.

As seen clearly in FIGS. 2 and 3, the curved section 38 of one solder tail 20 in each pair thereof extends in a direction transverse to the row of solder tails opposite the curved section 38 of the other solder tail in the same pair. In addition, each curved section 38 is shaped such that each solder tail engages printed circuit board 14 only at a portion of the curved section within its respective hole as seen in FIG. 2. Therefore the normal force exerted by the portion of the curved section 38 engaging within the hole 22 in the printed circuit board 14 of one solder tail in a pair is opposite to the normal force exerted by the engaging portion of the curved section 38 of the other solder tail of the pair.

Figure 8:
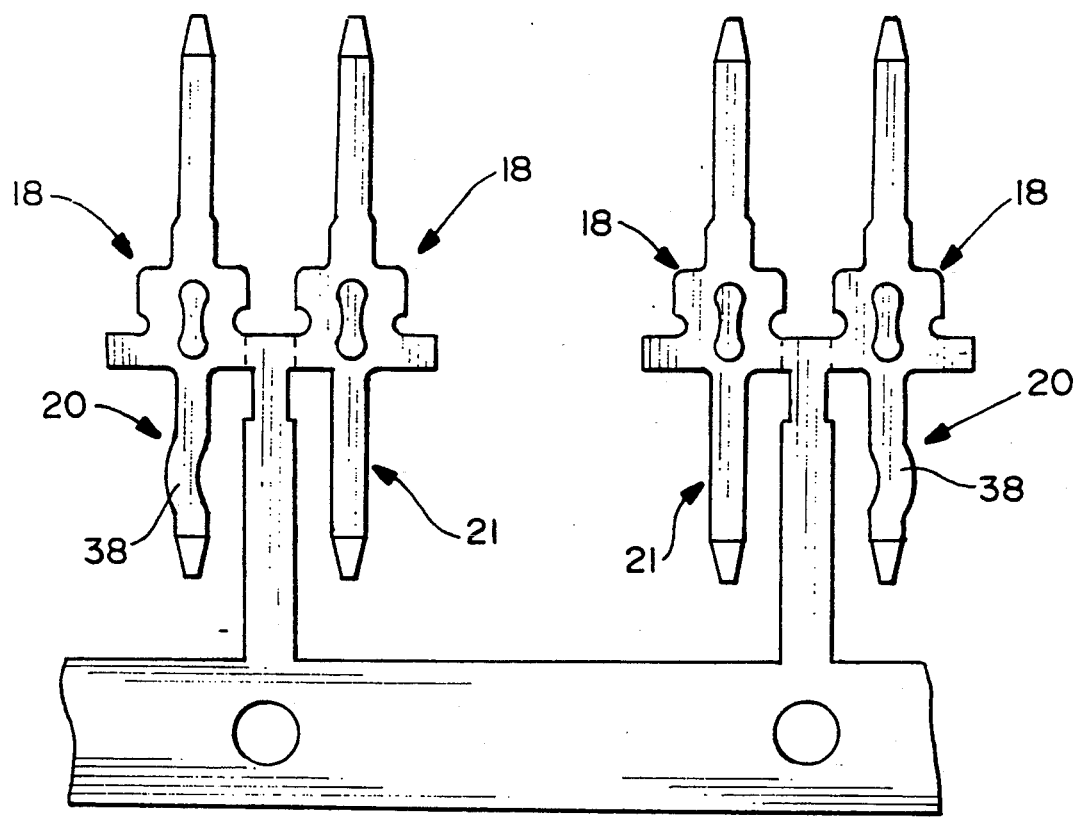
FIG. 8 shows two pairs of terminals with straight and curved tails.
Figure 9:
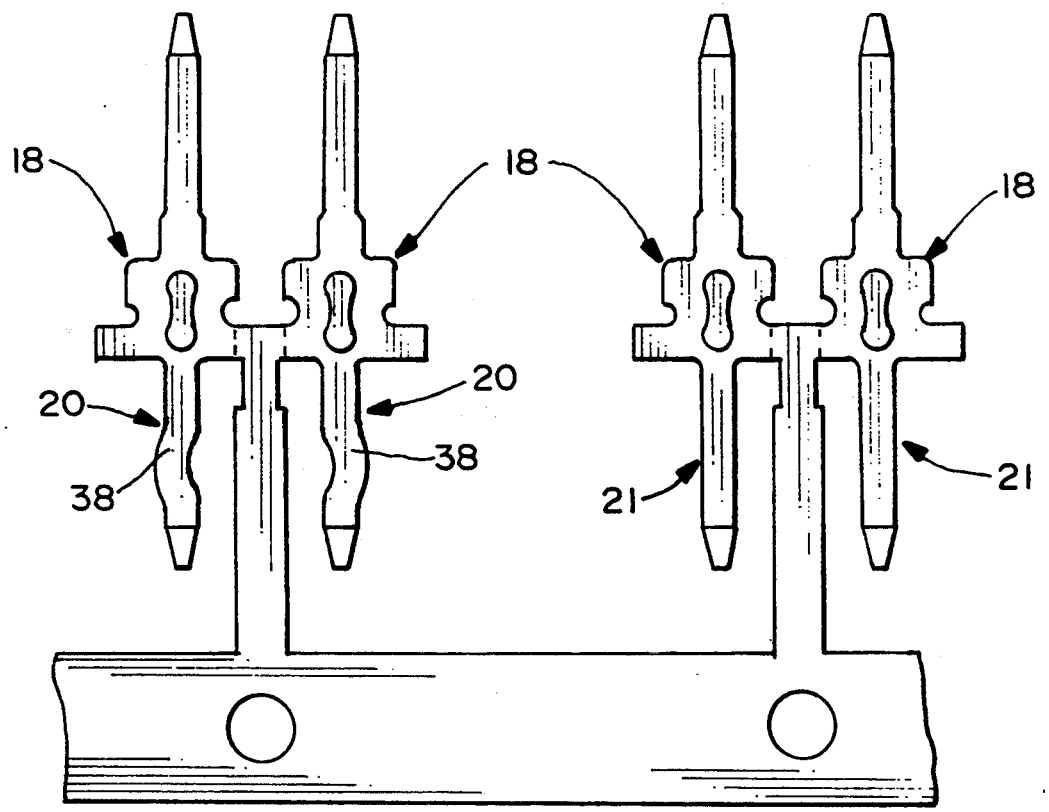
FIG. 9 shows an arrangement of terminals wherein pairs having curved tails may alternate with adjacent pairs having straight tails.

FIGS. 8 and 9 show alternate embodiments of the terminals 18 similar to FIG. 3 as the terminals exit the stamping processing machine. These embodiments have not only solder tails 20 with curved sections 38 but also straight solder tails 21. These embodiments allow for adjacent pairs of solder tails having one tail 20 with a curved section 28 and the other tail 21 of the pair to be straight, to alternate the curved and straight solder tails or for adjacent pairs of solder tails to alternate between one pair having both tails 20 with a curved section 38 and the adjacent pair having both straight tails 21.

Figures 4, 5:
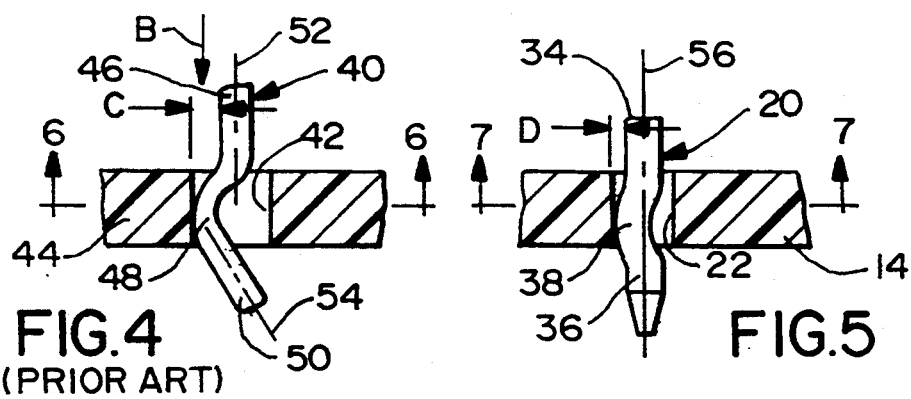
FIG. 4 is an elevation view of a terminal pin of the prior art inserted into a hole in a printed circuit board.
FIG. 5 is a view similar to that of FIG. 4, but of one of the stamped solder tails of the present invention.

FIGS. 4 and 5 show the importance of one feature of the invention which facilitates insertion of the solder tails into their respective holes in the printed circuit board and, thereby, facilitates mounting the electrical connector assembly on the board. More particularly, FIG. 4 shows a solder tail or terminal pin, generally designated 40, according to the prior art. The pin is insertable in the direction of arrow "B" into a hole 42 in a printed circuit board 44. The solder tail or terminal pin is a formed pin and includes an intermediate section 46 which generally would correspond to intermediate section 34 of solder tail 20 according to the invention. Pin 40 also includes a curved or bent section 48 between intermediate section 46 and a tip section 50. The dimension between the portion of the bent section 48 engaging within hole 42 and the edge of the intermediate section 46 is defined as the offset and is designated as dimension "C" in FIG. 4. Intermediate section 46 projects from the housing of the connector (not shown) along an axis 52 which is generally perpendicular to printed circuit board 44. However, note that the axis 54 of tip section 50 is at an angle to axis 52 and extends oblique to the printed circuit board. As stated above, such formed pins are not exacting, and it is very difficult to control the angle of tip section 50. Therefore, holes 42 must be made excessively large, or the tip sections make it difficult to properly locate the connector for insertion into the board.

Now, referring to FIG. 5, it can be seen that, according to the invention, intermediate section 34 and tip section 36 of solder tail 20 are collinear or coaxial on an axis 56. This means that the tip section 36 will be located at the true position of the terminal. This collinearity feature facilitates mounting the electrical connector assembly on the board.

Figures 6, 7:
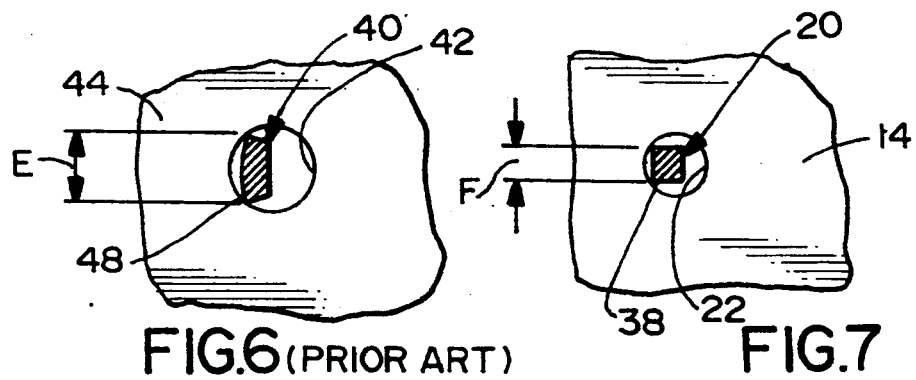
FIG. 6 is a section taken generally along line 6—6 of FIG. 4.
FIG. 7 is a section taken generally along line 7—7 of FIG. 5.

The importance of other features of the invention are shown in FIGS. 4, 5, 6 and 7. The coining operation which forms the bent section 48 in the prior art does not accurately form the offset dimension "C" as shown in FIG. 4 or the longitudinal dimension "E" of the cross section as shown in FIG. 6. Because of the inability to maintain tolerances of the offset dimension "C" and the longitudinal dimension "E" due to the extrusion of the metal during the coining process, the bent section 48 must have an excess offset. This excess offset is required to accommodate the variance of tolerances in the bent section 48 to ensure the engaging portion of the bent section contacts within the respective circuit board hole 42. This results in a higher insertion force than would be necessary. Accordingly, in the prior art, only some and not all of the pairs of solder tails may have the formed bent sections in order to reduce the insertion force.

According to the invention, the offset distance of the curved section 38, shown as dimension "C" in FIG. 5, and the longitudinal dimension "F" of the cross section of the engaging portion as shown in FIG. 7 are maintained accurately. The accurately dimensioned offset and cross section features, which can only be obtained by stamping the curved section 38, allow the engaging portion of each curved section 38 to exert an accurately predetermined amount of normal force within the hole 22 in the printed circuit board 14. Thus a connector having a large number of solder tails with curved sections can have almost the same total insertion force as a connector having a smaller number of terminals by merely changing the offset dimension. With such a stamped curved section, according to the invention, there is no need for an excess offset to accommodate any variance of tolerance resulting in an unnecessary increase in the insertion force.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A system for maintaining an electrical connector assembly mounted on a printed circuit board during soldering of the assembly to the board, comprising:
a housing having a plurality of terminals mounted therein, the terminals including solder tails projecting from the housing for insertion into respective holes in the printed circuit board,
each terminal being stamped in planar form of sheet metal material,
the solder tails being arranged in a row of pairs thereof, with the solder tails in each pair being in a plane transverse to the row,
all of the solder tails being of similar shape with each solder tail including a straight intermediate section projecting from the housing, a straight tip section for insertion into a respective hole in the printed circuit board, and an offset curved section stamped in a curve integrally connecting the intermediate and tip sections, all of said sections having planar surfaces in the same plane, said curved section having a stamped edge generally perpendicular to said planar surfaces,
the curved section of one solder tail extending in a direction transverse to the row opposite the curved section of the other solder tail in each pair thereof,
each curved section being shaped such that the stamped edge of each solder tail engages the printed circuit board only at a portion of the stamped edge of the curved section within its respective hole, and
the straight intermediate section and the straight tip section of each solder tail being collinear to each other.

2. A system for maintaining an electrical connector assembly mounted on a printed circuit board during soldering of the assembly to the board, comprising:
a housing having a plurality of terminals mounted therein, the terminals including solder tails projecting from the housing for insertion into respective holes in the printed circuit board,
each terminal being stamped in planar form of sheet metal material,
all of the solder tails being of similar shape with each solder tail including a straight intermediate section projecting from the housing, a straight tip section for insertion into a respective hole in the printed circuit board, and an offset curved section stamped in a curve integrally connecting the intermediate and tip sections, all of said sections having planar surfaces in the same plane, said curved section having a stamped edge generally perpendicular to said planar surfaces,
the curved section of one solder tail extending in a direction transverse to the terminals lined up in a row opposite the curved section of the other solder tail in each pair thereof,
each curved section being shaped such that the stamped edge of each solder tail engages the printed circuit board only at a portion of the stamped edge of the curved section within its respective hole, and
the straight intermediate section and the straight tip section of each solder tail being collinear to each other.

3. A system for maintaining an electrical connector assembly mounted on a printed circuit board during soldering of the assembly to the board, comprising:
a housing having a plurality of terminals mounted therein, the terminals including solder tails projecting from the housing for insertion into respective holes in the printed circuit board,
each terminal being stamped in planar form of sheet metal material,
all of the solder tails being of similar shape with each solder tail including a straight intermediate section projecting from the housing, a straight tip section for insertion into a respective hole in the printed circuit board, and an offset curved section stamped in a curve integrally connecting the intermediate and tip sections, all of said sections having planar surfaces in the same plane, said curved section having a stamped edge generally perpendicular to said planar surfaces, and
each curved section being shaped such that the stamped edge of each solder tail engages the printed circuit board only at a portion of the stamped edge of the curved section within its respective hole.

4. The system of claim 3 wherein the terminals are arranged in pairs where the portion of the stamped edge of the curved section engaging within the printed circuit board hole of one terminal of the pair exerts a normal force opposite a force exerted by the stamped edge engaging portion of the curved section of the other terminal of said pair.

5. A system for maintaining an electrical connector assembly mounted on a printed circuit board during soldering of the assembly to the board, comprising:

a housing having a plurality of terminals mounted therein, the terminals including solder tails projecting from the housing for insertion into respective holes in the printed circuit board, each terminal being stamped in planar form of sheet metal material, the solder tails being arranged in a row of adjacent pairs thereof, with the solder tails in each pair being in a plane transverse to the row, one of the solder tails in each pair including a straight intermediate section projecting from the housing, a straight tip section for insertion into a respective hole in the printed circuit board, and an offset curved section stamped in a curve, integrally connecting the intermediate and tip sections, all of said sections having planar surfaces in the same plane and said curved section having a stamped edge generally perpendicular to said planar surface, the stamped edge of the curved section of one solder tail extending in a direction transverse to the row opposite a curved section of the other solder tail in each pair thereof, each curved section being shaped such that the stamped edge of each solder tail engages the printed circuit board only at a portion of the stamped edge of the curved section within its respective hole, and the straight intermediate section and the straight tip section of each solder tail being collinear to each other.

6. A system for maintaining an electrical connector assembly mounted on a printed circuit board during soldering of the assembly to the board, comprising:

a housing having a plurality of terminals mounted therein, the terminals including solder tails projecting from the housing for insertion into respective holes in the printed circuit board, each terminal being stamped in planar form of sheet metal material, the solder tails being arranged in a row of alternating pairs thereof, with the solder tails in each pair being in a plane transverse to the row, the solder tails of one alternating pair including a straight intermediate section projecting from the housing, a straight tip section for insertion into a respective hole in the printed circuit board, and an offset curved section between the intermediate and tip sections, the curved section of one solder tail extending in a direction transverse to the row opposite the curved section of the other solder tail in each pair thereof, each curved section being shaped such that each solder tail engages the printed circuit board only at a portion of the curved section within its respective hole, and the straight intermediate section and the straight tip section of each solder tail being collinear to each other, and the solder tails of the other alternating pair projecting from the housing including a straight pin section.

7. A system for maintaining an electrical connector assembly mounted on a printed circuit board during soldering of the assembly to the board, comprising:

a housing having a plurality of terminals mounted therein, the terminals including solder tails projecting from the housing for insertion into respective holes in the printed circuit board, each terminal being stamped in planar form of sheet metal material, the solder tails being arranged in a row of adjacent pairs thereof, with the solder tails in each pair being in a plane transverse to the row, one of the solder tails in each pair including a straight intermediate section projecting from the housing, a straight tip section for insertion into a respective hole in the printed circuit board, and an offset curved section between the intermediate and tip sections, the curved section of one solder tail extending in a direction transverse to the row, each curved section being shaped such that each solder tail engages the printed circuit board only at a portion of the curved section within its respective hole, the straight intermediate section and the straight tip section of each solder tail being collinear to each other, the other solder tails in each pair projecting from the housing including a straight pin section, wherein the location of the solder tail including an offset curved section in one pair alternates with the location of the solder tail including a straight pin section in each adjacent pair of solder tails.

* * * * *